United States Patent
Schweiger

(10) Patent No.: US 9,876,697 B2
(45) Date of Patent: Jan. 23, 2018

(54) STOCHASTIC JITTER MEASURING DEVICE AND METHOD

(71) Applicant: Rohde & Schwarz GmbH & Co. KG, Munich (DE)

(72) Inventor: Thomas Schweiger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/211,207

(22) Filed: Jul. 15, 2016

(65) Prior Publication Data
US 2017/0302544 A1    Oct. 19, 2017

Related U.S. Application Data

(60) Provisional application No. 62/322,969, filed on Apr. 15, 2016.

(51) Int. Cl.
| | |
|---|---|
| H04L 12/26 | (2006.01) |
| H04L 27/26 | (2006.01) |
| H04L 1/20 | (2006.01) |
| H04L 7/033 | (2006.01) |
| H04L 29/06 | (2006.01) |
| G01R 29/26 | (2006.01) |

(52) U.S. Cl.
CPC ........ H04L 43/087 (2013.01); H04L 27/2688 (2013.01); *G01R 29/26* (2013.01); *H04L 1/205* (2013.01); *H04L 7/0337* (2013.01); *H04L 65/80* (2013.01)

(58) Field of Classification Search
CPC ........ H04L 1/205; H04L 43/087; G01R 29/26
See application file for complete search history.

(56) References Cited

U.S. PATENT DOCUMENTS

| | | | | |
|---|---|---|---|---|
| 6,167,359 A | * | 12/2000 | Demir | G01R 31/2824 375/226 |
| 6,240,130 B1 | | 5/2001 | Burns et al. | |
| 6,640,193 B2 | | 10/2003 | Kuyel | |
| 2005/0031029 A1 | * | 2/2005 | Yamaguchi | G01R 29/26 375/226 |
| 2010/0017186 A1 | * | 1/2010 | Kim | G06F 17/5036 703/14 |
| 2010/0157066 A1 | * | 6/2010 | Challapali | H04N 5/08 348/180 |
| 2013/0336425 A1 | * | 12/2013 | Lee | H04L 27/12 375/303 |

OTHER PUBLICATIONS

Wu, Minshun, et al., "Accurate and cost effective technique for jitter and noise separation based on single-frequency measurement", Electronics Letters, Jan. 21, 2016, vol. 52, No. 2, pp. 106-107.

* cited by examiner

*Primary Examiner* — Ross Varndell
(74) *Attorney, Agent, or Firm* — Lee & Hayes, PLLC

(57) ABSTRACT

A jitter measuring setup (10) comprises a signal generator (14), a sample-and-hold circuit (15), and the inventive all stochastic jitter measuring device (1) comprising signal acquisition means (2) and calculation means (3). The input signal of the sample-and-hold circuit (15) is generated by the signal generator (14). Furthermore, the output signal of the sample-and-hold circuit (15), respectively the input signal of the measuring device (1), is comprised of a superposition of the sampled input signal of the sample-and-hold circuit (15) and a cyclostationary random process.

19 Claims, 2 Drawing Sheets

STOCHASTIC JITTER MEASURING DEVICE AND METHOD

This Application claims priority to U.S. Provisional Application No. 62/322,969, filed 15 Apr. 2016, which is incorporated herein by reference.

TECHNICAL FIELD

The invention relates to a jitter measuring device, especially to a jitter measuring device solely based on stochastics, and to an all stochastic method for measuring jitter.

BACKGROUND ART

Generally, in times of increasing digitalization, analog signals have to be digitized, for example, with the aid of sample-and-hold circuits which sample the respective analog signals at certain time intervals typically determined by the clock signal of a clock generator.

However, due to noise and other distortions, in relation to this reference clock source, deviations from true periodicity arise, which is called jitter. Therefore, jitter is a major characteristic value of sample-and-hold circuits, or respectively of systems applying such circuits, which leads to a growing need of a jitter measuring device and a jitter measuring method.

U.S. Pat. No. 6,640,193 B2 discloses jitter measuring based on signal-to-noise ratio (SNR) measurements. In this case, two measurements at two different frequencies, respectively amplitudes, or at two different phases are performed and then the respective SNR-difference is taken to get the jitter. Additionally, to remove the sampled signal, a Fourier transform, respectively a fast Fourier transform (FFT), is used, which leads to low sensitivity and error sources because, for instance, FFT leakage makes it impossible to zero-out all the appropriate bins in the FFT. As it can be seen, such jitter measurements are not only rather complex and therefore costly but also prone to errors.

Accordingly, there is a need to provide a measuring device and a measuring method for measuring jitter, on the one hand, in a simple and cost-effective manner, and on the other hand, with highest accuracy and best distortion robustness.

SUMMARY OF THE INVENTION

According to a first aspect of the invention, a measuring device for measuring jitter of an input signal consisting of sampling values is provided. The measuring device comprises signal acquisition means and calculation means. The signal acquisition means are configured to gain a set of samples of a cyclostationary random process $K(\Phi)$, to which the jitter of the input signal is mapped, by obtaining a first number of samples N for a second number of unique phases $N_{ph}$, and sorting the first number of samples N by phase up front. The calculation means are configured to calculate the cyclostationary variance $\sigma_K^2(\Phi)$ of the input signal.

According to a first preferred implementation form of the first aspect, the calculation means are further configured to calculate the cyclostationary variance $\sigma_K^2(\Phi)$ comprising a number of frequency components according to the input signal, and to calculate the amplitude of at least one of said number of frequency components by fitting at least one function prototype $F(\Phi)$ to the cyclostationary variance $\sigma_K^2(\Phi)$ with due regard to the second number of unique phases $N_{ph}$, which leads to at least one fitted function, and to calculate the jitter of the input signal, which is proportional to the amplitude of said at least one fitted function.

According to a further preferred implementation form of the first aspect, the calculation means are configured in a manner that the function fitting is done by calculating a scaled cross correlation at lag zero of the cyclostationary variance $\sigma_K^2(\Phi)$ with the function prototype $F(\Phi)$.

According to a further preferred implementation of the first aspect, the function prototype $F(\Phi)$ is a complex exponential function or any kind of sinus or cosine function.

According to a further preferred implementation form of the first aspect, the calculation means are configured to calculate a fitting parameter $\sigma_K^2(\Phi)$, such that the product $\sigma_{Kfit}^2 F(\Phi)$ of the fitting parameter $\sigma_{Kfit}^2$ and the function prototype $F(\Phi)$ matches the term $\cos(2\Phi)$ or $\sin(2\Phi)$, depending on the zero-phase of the phase-sorting that was done up front, within $\sigma_K^2(\Phi)$ best.

According to a further preferred implementation form of the first aspect, for the calculation of the jitter of the input signal, the signal acquisition means and the calculation means are configured to obtain and to consider at least two cyclostationary variances $\sigma_{K1}^2(\Phi)$, $\sigma_{K2}^2(\Phi)$ at different frequencies $f_1$, $f_2$ in order to eliminate noise being frequency-invariant and non-stationary.

According to a further preferred implementation form of the first aspect, the calculation means are configured to consider a predefined accuracy P of the calculation of the jitter of the input signal.

According to a further preferred implementation form of the first aspect, the calculation means are configured to calculate the minimum number of samples required $N_{min}$ a priori according to the following equation:

$$N_{min} = ((2\pi A \sigma_J)^4 (f_1^4 - f_2^4)^4 P^2)^{-1} * 4R^2 (\%_{16}(f_1^4 + f_2^4) \\ (2\pi A \sigma_J)^4 + \overline{\sigma_N^2}(f_1^2 + f_2^2)(2\pi A \sigma_J)^2 + 2(\overline{\sigma_N^2})^2),$$

wherein for a given accuracy P, confidence interval R in multiples of one sigma, minimum expected jitter $\sigma_J^2$, frequencies $f_1$, $f_2$, amplitude A and mean noise $\overline{\sigma_N^2}$ present in the input signal, $N_{min}$ is calculated.

According to a further preferred implementation form of the first aspect, wherein, if just one measurement at frequency f is done, the calculation means are configured to calculate the minimum number of samples required $N_{min}$ a priori according to the following equation:

$$N_{min} = ((2\pi f A \sigma_J)^4 P^2)^{-1} * 4R^2 (\%_{16}(2\pi f A \sigma_J)^4 + \\ \overline{\sigma_N^2}(2\pi f A \sigma_J)^2 + (\overline{\sigma_N^2})^2),$$

wherein for a given accuracy P, confidence interval R in multiples of one sigma, minimum expected jitter $\sigma_J^2$, amplitude A and mean noise $\overline{\sigma_N^2}$ present in the input signal, $N_{min}$ is calculated.

According to a second aspect of the invention, a measuring method for measuring jitter of an input signal consisting of sampling values is provided. The method comprises the steps of gaining a set of samples of a cyclostationary random process $K(\Phi)$, to which the jitter of the input signal is mapped, by obtaining a first number of samples N for a second number of unique phases $N_{ph}$, sorting the first number of samples N by phase up front, and calculating the cyclostationary variance $\sigma_K^2(\Phi)$ of the input signal.

According to a first preferred implementation form of the second aspect, the cyclostationary variance $\sigma_K^2(\Phi)$ comprising a number of frequency components according to the input signal, and the amplitude of at least one of said number of frequency components are calculated by fitting at least one function prototype $F(\Phi)$ to the cyclostationary variance $\sigma_K^2(\Phi)$ with due regard to the second number of unique phases $N_{ph}$, which leads to at least one fitted function, and to calculate the jitter of the input signal, which is proportional to the amplitude of said at least one fitted function.

According to a further preferred implementation of the second aspect, the function fitting is done by calculating a scaled cross correlation at lag zero of the cyclostationary variance $\sigma_K^2(\Phi)$ with the function prototype $F(\Phi)$.

According to a further preferred implementation of the second aspect, the function prototype $F(\Phi)$ is a complex exponential function or any kind of sinus or cosine function.

According to a further preferred implementation of the second aspect, a fitting parameter $\sigma_{Kfit}^2$ is calculated, such that the product $\sigma_{Kfit}^2 F(\Phi)$ of the fitting parameter $\sigma_{Kfit}^2$ and the function prototype $F(\Phi)$ matches the term $\cos(2\Phi)$ or $\sin(2\Phi)$, depending on the zero-phase of the phase-sorting that was done up front, within $\sigma_K^2(\Phi)$ best.

According to a further preferred implementation of the second aspect, for the calculation of the jitter of the input signal, at least two cyclostationary variances $\sigma_{K1}^2(\Phi), \sigma_{K2}^2(\Phi)$ at different frequencies $f_1, f_2$ are obtained and considered in order to eliminate noise being frequency-invariant and non-stationary.

According to a further preferred implementation of the second aspect, a predefined accuracy P of the calculation of the jitter of the input signal is considered.

According to a further preferred implementation of the second aspect, the minimum number of samples required $N_{min}$ is calculated a priori according to the following equation:

$$N_{min} = ((2\pi A \sigma_J)^4 (f_1^4 - f_2^4)^4 P^2)^{-1} * 4R^2 (\tfrac{7}{16}(f_1^4 + f_2^4)$$
$$(2\pi A \sigma_J)^4 + \overline{\sigma_N^2}(f_1^2 + f_2^2)(2\pi A \sigma_J)^2 + 2(\overline{\sigma_N^2})^2),$$

wherein for a given accuracy P, confidence interval R in multiples of one sigma, minimum expected jitter $\sigma_J^2$, frequencies $f_1, f_2$, amplitude A and mean noise $\overline{\sigma_N^2}$ present in the input signal, $N_{min}$ is calculated.

According to a further preferred implementation of the second aspect, if just one measurement at frequency f is done, the minimum number of samples required $N_{min}$ is calculated a priori according to the following equation:

$$N_{min} = ((2\pi f A \sigma_J)^4 P^2)^{-1} * 4R^2 (\tfrac{7}{16}(2\pi f A \sigma_J)^4 + \overline{\sigma_N^2}(2\pi f A \sigma_J)^2 + (\overline{\sigma_N^2})^2),$$

wherein for a given accuracy P, confidence interval R in multiples of one sigma, minimum expected jitter $\sigma_J^2$, amplitude A and mean noise $\overline{\sigma_N^2}$ present in the input signal, $N_{min}$ is calculated.

According to a third aspect of the invention, a computer program with program code means for performing all steps according to the second aspect, if the program is executed on a computer device or digital signal processor, is provided. The computer program can also comprise one, several or all preferred implementations as outlined above.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFFERED EMBODIMENTS

Figure 1:
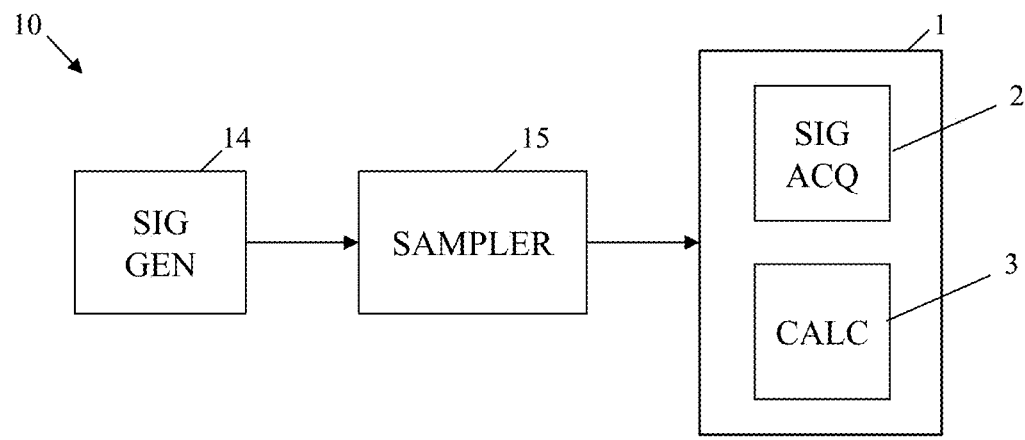
FIG. 1 shows a block diagram of an exemplary measuring setup for applying the inventive measuring device.

Firstly, a block diagram of an exemplary measuring setup 10 for applying the inventive measuring device 1 is illustrated by FIG. 1.

The input signal of the sample-and-hold circuit 15 is generated by the signal generator 14 and hereinafter called $S(\Phi, A)$ with phase $\Phi$ and amplitude A. The output signal of the sample-and-hold circuit 15, respectively the input signal of the measuring device 1 comprising signal acquisition means 2 and calculation means 3, is comprised of a superposition of the sampled input signal of the sample-and-hold circuit 15 hereinafter called $U(\Phi, A)$ and a cyclostationary random process which is denoted by $K(\Phi)$.

In addition to this, it is to be noted that for all quantities involved, a formulation solely depending on phase $\Phi$ but not on time t is used, since the entire output signal of the sample-and-hold circuit 15 is treated as a cyclostationary random process which is independent of time and frequency.

Furthermore, jitter is generally defined as the standard deviation of a normally distributed random process, which is hereinafter called J.

Due to the sampling process, using input signal S of the sample-and-hold circuit 15, the stationary random process J is mapped to the above-mentioned cyclostationary random process $K(\Phi)$. As all parameters of this mapping are known, it is possible to calculate the properties of process J from those observed from process $K(\Phi)$.

Moreover, dealing with a cyclostationary random process, all samples obtained from the output of the sample-and-hold circuit 15 are sorted by phase up front.

If this signal acquisition is done properly, a predetermined number of samples N for a predetermined number of unique phases $N_{ph}$ is obtained. It can be shown that N and $N_{ph}$ can be calculated a priori knowing only a few properties of the measurement setup and the desired accuracy.

Once the above-mentioned sorting is done by the signal acquisition means 2, a set of samples of the process $K(\Phi)$ has been gained, which can be processed further to calculate the jitter with the aid of the calculation means 3.

Doing so, the cyclostationary variance $\sigma_K^2(\Phi)$ is calculated. The most interesting property of this step is that the sampled signal $U(\Phi, A)$ and its harmonics are all irrelevant and have no influence on the calculated cyclostationary variance at all. They rather represent the cyclostationary mean $\mu_k(\Phi)$. The relevant information is solely contained in $\sigma_K^2(\Phi)$. This is one of the major benefits of the proposed method, as no signal removal is required, avoiding related drawbacks. It is worth noting that even the harmonics of the signal are eliminated as they are as well part of the cyclostationary mean $\mu_k(\Phi)$.

Furthermore, due to the fact that the function and amplitude of the input signal S of the sample-and-hold circuit 15 are known, the function of the cyclostationary variance is known as well. The relationship between cyclostationary variance, jitter and said input signal generated by the signal generator 14 can be calculated to $$\sigma_K^2(\Phi) = \sigma_J^2 (2\pi f)^2 \left(\frac{\partial S}{\partial \Phi}\right)^2 + \sigma_{Nc}^2(\Phi) + \sigma_{Ns}^2, \quad (1)$$

wherein $\sigma_J$ denotes the jitter, $\pi$ is pi, f is the frequency, $\sigma_{Nc}^2(\Phi)$ denotes non-jitter-related cyclostationary noise and $\sigma_{Ns}^2$ is non-jitter-related stationary noise. Additionally, it should be noted that both non-jitter-related cyclostationary noise and non-jitter-related stationary noise are undesired.

Furthermore, the term $$\left(\frac{\partial S}{\partial \Phi}\right)^2$$

appearing in the foregoing equation (1) is the term one should be most interested in, especially the part of it that depends on $\Phi$.

For further illustration, let the input signal of the sample-and-hold circuit 15 exemplarily be A sin($\Phi$), which leads to $$\sigma_K^2(\Phi) = \sigma_J^2(2\pi f)^2 \frac{A^2}{2}(1+\cos(2\Phi))+\sigma_{Nc}^2(\Phi)+\sigma_{Ns}^2, \quad (2)$$

which shows that for the cyclostationary variance, one gets a stationary and cyclostationary part.

Consequently, ordinary signal-to-noise ratio (SNR) based jitter measurements would take the SNR-difference of two different measurements to get the jitter.

However, for the highest accuracy possible, the present invention is not SNR based but rather based on function parameter fit applied on the cyclostationary variance, which is done in a way such that it is very sensitive to just the jitter-specific shape of the curve.

This is exemplarily achieved by calculating a scaled cross correlation at lag zero of $\sigma_K^2(\Phi)$ with a function prototype F($\Phi$) obtaining a fitting parameter $\sigma_{Kfit}^2$, such that the product $\sigma_{Kfit}^2 F(\Phi)$ of the fitting parameter $\sigma_{Kfit}^2$ and the function prototype F($\Phi$) matches the term cos(2$\Phi$) or sin(2$\Phi$), depending on the zero-phase of the phase-sorting that was done up front, within $\sigma_K^2(\Phi)$ best, which especially has the following advantages:

insensitive to stationary noise,
a single measurement is sufficient,
robust against any interferences which may exist at certain phases, and
inherently robust against the presence of second order harmonics of the signal source, respectively the signal generator 14.
requires no special relation between the phase of the clock and the input signal of the sample-and-hold circuit.

Now, in order to illustrate the above-mentioned distortion robustness, let the input signal of the sample-and-hold circuit 15 be $$S(\Phi, A, B) = A \sin(\Phi) + B \sin(\Phi), \quad (3)$$

which leads to a cyclostationary variance, for which the following applies:

$$\sigma_K^2(\Phi) = \sigma_J^2(2\pi f)^2 \left(\frac{A^2}{2} + \frac{A^2}{2}\cos(2\Phi) + 2AB\cos(\Phi) + 2AB\cos(3\Phi) + 4B^2\cos(4\Phi) + 4B^2\right) + \sigma_{Nc}^2(\Phi) + \sigma_{Ns}^2. \quad (4)$$

As it can be seen from equation (4), the cyclostationary variance has grown quite a bit depending on the amplitude of the second harmonic.

Nevertheless, the above-mentioned function parameter fit is only sensitive to the term proportional to cos(2$\Phi$) or sin(2$\Phi$), depending on the zero-phase of the phase-sorting that was done up front, which is advantageously independent of the amplitude of the second harmonic.

In addition, it should be mentioned that for a third order harmonic and in general as well, $\sigma_K^2(\Phi)$ can be calculated in a similar manner and measures to eliminate or even benefit from the harmonics can be deduced.

Moreover, with the aid of the calculation means 3, once the above-mentioned fitting parameter $\sigma_{Kfit}^2$ is found, the jitter can be calculated to $$\text{Jitter} = \sqrt{\sigma_J^2} = \sqrt{2\sigma_{Kfit}^2(2\pi f A)^{-2}}. \quad (5)$$

As already mentioned above, one measurement suffices to detect the jitter, but even so, it turns out that performing two measurements at different frequencies may benefit the overall accuracy, especially if frequency-invariant, non-stationary noise $\sigma_{Ncfi}^2(\Phi)$ such as post-sampling-jitter exemplarily produced by a post sampler being used for the data acquisition with the aid of the signal acquisition means 2, is present in the input signal of the measuring device 1.

In addition to this, it is to be noted that frequency-variant, non-stationary noise is hereinafter represented by $\sigma_{Ncfv}^2(\Phi)$ such that the following equation applies:

$$\sigma_{Nc}^2(\Phi) = \sigma_{Ncfi}^2(\Phi) + \sigma_{Ncfv}^2(\Phi). \quad (6)$$

The above-mentioned frequency-differential procedure is to be seen as an extension to the one already outlined so far. With this enhanced approach, even though a single measurement would be sufficient, two measurements at different frequencies are conducted and processed in the exact same way as outlined in order to obtain two cyclostationary variances $\sigma_{K1}^2(\Phi)$ and $\sigma_{K2}^2(\Phi)$ with the aid of the signal acquisition means 2 and the calculation means 3 of the measuring device 1. In this case, the calculation means 3 are further configured to take the difference of said variances in order to obtain $\sigma_K^2(\Phi)$, such that $$\sigma_K^2(\Phi) = \sigma_{K1}^2(\Phi) - \sigma_{K2}^2(\Phi) = \quad (7)$$

$$\sigma_J^2(2\pi)^2(f_1^2 - f_2^2)\left(\frac{\partial S}{\partial \Phi}\right)^2 + \sigma_{Ncfv1}^2(\Phi) - \sigma_{Ncfv2}^2(\Phi) + \sigma_{Ns1}^2 - \sigma_{Ns2}^2.$$

As it can be seen, this step of subtraction according to equation (7) advantageously eliminates the above-mentioned frequency-invariant, non-stationary noise $\sigma_{Ncfi}^2(\Phi)$ because it is the same for both measurements.

Additionally and further advantageously, if $\sigma_{Ns1}^2$ and $\sigma_{Ns2}^2$ have similar values, they may cancel out as well but that is however not a requirement and may not be relied on.

Henceforth, with the aid of the calculation means 3, the cyclostationary variance $\sigma_K^2(\Phi)$ is processed as outlined and once the above-mentioned fitting parameter $\sigma_{Kfit}^2$ is obtained, the jitter is calculated to $$\text{Jitter} = \sqrt{\sigma_J^2} = \sqrt{2\sigma_{Kfit}^2(2+A)^{-2}(f_1^2 - f_2^2)^{-1}}. \quad (8)$$

Furthermore, it is to be pointed that all the outlined calculations are solely based on stochastics. This advantageously allows for the calculation of the minimum number of samples required $N_{min}$ a priori as described in the following.

For a given accuracy P, confidence interval R (in multiples of one sigma), minimum expected jitter $\sigma_J^2$, frequencies $f_1$, $f_2$, amplitude A and means noise $\overline{\sigma_N^2}$ present in the output signal of the sample-and-hold circuit 15, respectively in the input signal of the measuring device 1, said minimum number of samples $N_{min}$ can be calculated.

In the following, for the sake of simplicity, let be $$\sigma_{Ns1}^2 = \sigma_{Ns2}^2 = \sigma_{Ns}^2, \text{ and} \quad (9)$$

$$\sigma_{Ncfv1}^2(\Phi) = \sigma_{Ncfv2}^2(\Phi) = \sigma_{Ncfv}^2(\Phi), \quad (10)$$

such that $$\overline{\sigma_N^2} = \overline{\sigma_{Ncfv}^2} + \sigma_{Ns}^2. \quad (11)$$

In most practical situations, the foregoing simplifications hold, at least if measures to eliminate $\sigma_{Ncfv<1,2>}^2(\Phi)$ are taken. Otherwise, a similar but more sophisticated calculation may be required.

Now, by analogy with the explanations above, starting with a signal $S(\Phi,A,B) = A \sin(\Phi)$ and a substitution for better readability $\sigma_{Nj} = (2A\pi f\sigma_J)^2$, the cyclostationary variance $\sigma_K^2(\Phi)$ can also be written as follows:

$$\sigma_K^2(\Phi) = \sigma_{Nj}^2 \cos^2(\Phi) + \sigma_{Ns}^2. \quad (12)$$

In a real measurement, $\sigma_K^2(\Phi)$ is a sample variance calculated from $N_{sp}$ samples at $N_{ph}$ discrete values for $\Phi$. Using the chi-square distribution with $N_{sp}$ degrees of freedom, the variance of the sample variance calculated from a normal distributed random variable can be calculated, which results in $$\sigma_{\sigma_K^2}^2(\Phi) = \frac{2(\sigma_{Nj}^2 \cos^2(\Phi) + \sigma_{Ns}^2)^2}{N_{sp} - 1}. \quad (13)$$

Furthermore, a function parameter fit onto $\sigma_K^2(\Phi)$ by calculating a Fourier coefficient is done, obtaining $\sigma_{Kfit}^2$ such that $\sigma_{Kfit}^2 \cos(2\Phi)$ absolutely matches the term $\cos(2\Phi)$ within $\sigma_K^2(\Phi)$, which leads to the following equation:

$$\sigma_{Kfit}^2 = \frac{1}{\pi} \int_0^{2\pi} \sigma_K^2(\Phi) \cos(2\Phi) \partial \Phi. \quad (14)$$

As we are interested in the statistical effects of the fit on $\sigma_{Kfit}^2$, the integral formulation given above is changed to series formulation in order to represent the finite number of phases $N_{ph}$ as follows:

$$\sigma_{Kfit}^2 = \frac{2}{N_{ph}} \sum_{m=0}^{N_{ph}-1} \sigma_K^2 \left(\frac{m\Phi}{N_{ph}}\right) \cos\left(\frac{2m\Phi}{N_{ph}}\right). \quad (15)$$

Therefore, the variance of $\sigma_{Kfit}^2$ can be calculated according to the following equation:

$$\sigma_{\sigma_{Kfit}^2}^2 = \left(\frac{2}{N_{ph}}\right)^2 \sum_{m=0}^{N_{ph}-1} \sigma_{\sigma_K^2}^2 \left(\frac{m\Phi}{N_{ph}}\right) \cos^2\left(\frac{2m\Phi}{N_{ph}}\right). \quad (16)$$

If $N_{ph}$ is not of a particular small value, the sum can be approximated by an integral. For the present invention, the respective approximation holds if $N_{ph} \geq 8$, which is usually not a limitation and leads to $$\sigma_{\sigma_{Kfit}^2}^2 = \frac{2}{N_{ph}} \frac{2}{2\pi} \int_0^{2\pi} \sigma_{\sigma_K^2}^2(\Phi) \cos^2(2\Phi) \partial \Phi. \quad (17)$$

Inserting equation (13) into equality (17) and applying the approximation $N_{sp} - 1 \simeq N_{sp}$ yields $$\sigma_{\sigma_{Kfit}^2}^2 = \frac{4}{N_{ph}N_{sp}} \frac{1}{\pi} \left( \sigma_{Nj}^4 \int_0^{2\pi} \cos^4(\Phi) \cos^2(2\Phi) \partial \Phi + \right. \quad (18)$$

$$\left. 2\sigma_{Nj}^2 \sigma_{Ns}^2 \int_0^{2\pi} \cos^2(\Phi) \cos^2(2\Phi) \partial \Phi + \sigma_{Ns}^4 \int_0^{2\pi} \cos^2(2\Phi) \partial \Phi \right).$$

Evaluating the integrals and applying the substitution $N = N_{sp} N_{ph}$, wherein N is the overall number of samples, results in $$\sigma_{\sigma_{Kfit}^2}^2 = \frac{4}{N} \left( \frac{7}{16} \sigma_{Nj}^4 + \sigma_{Nj}^2 \sigma_{Ns}^2 + \sigma_{Ns}^4 \right). \quad (19)$$

Once $\sigma_{Kfit}^2$ is determined, it is multiplied by factor of two, then the square-root function is applied in order to calculate $\sigma_{Nj}$, and finally $\sigma_{Nj}$ divided by $2\pi Af$ to obtain $\sigma_j$. The multiplication steps have no effect on the statistical properties of the outcome except a scaling but do not change the distribution. The square-root function indeed does.

The distribution of $\sigma_{Nj}$ is a special type of chi-distribution due to the fit that is applied on the intermediary chi-squared distribution. Furthermore, by the asymptotic properties of the chi-distribution and also backed by the central-limit-theorem, if the above-mentioned overall number of samples N is sufficiently large, the distribution of $\sigma_{Kfit}^2$ is a normal distribution.

Usually, this condition is valid for the jitter measurement and therefore an approximation to calculate $\sigma_{94_{Nj}}$ using $\sigma_{\sigma_{Kfit}^2}$ and $\sigma_{Kfit}^2$ could be developed. This approximation is based on a linearization of the square-root function around $x_0$:

$$sqrt(x, x_0) = \sqrt{x_0} + \frac{x - x_0}{2\sqrt{x_0}}. \quad (20)$$

Now, if $$\sigma_{\sigma_{Kfit}^2}$$

is sufficiently small in relation to $\sigma_{Kfit}^2$, the foregoing approximation holds and $\sigma_{\sigma_{Nj}}$ can be expressed using the approximation as follows:

$$\sigma_{\sigma_{Nj}} = sqrt\left(2\sigma_{Kfit}^2 + 2\sigma_{\sigma_{Kfit}^2}^2, 2\sigma_{Kfit}^2\right) - \sqrt{2\sigma_{Kfit}^2} = \quad (21)$$

$$\sqrt{2\sigma_{Kfit}^2} + \frac{2\sigma_{\sigma_{Kfit}^2}^2}{2\sqrt{2\sigma_{Kfit}^2}} - \sqrt{2\sigma_{Kfit}^2} = \frac{2\sigma_{\sigma_{Kfit}^2}^2}{2\sqrt{2\sigma_{Kfit}^2}}.$$

Moreover, the desired accuracy of $\sigma_{Nj}$ or $\sigma_J$, respectively, is called P with $0 < P < 1$. For instance, $P = 0.1$ means 10% accuracy. In addition to this, a corresponding confidence interval R in multiples of a standard-deviation is defined. For example, $R = 1$ means that the probability of meeting the desired accuracy is 68.27%.

These conditions are represented by the following inequality:

$$(1+P)\sqrt{2\sigma_{Kfit}^2} > \sqrt{2\sigma_{Kfit}^2} + R\frac{2\sigma_{\sigma_{Kfit}^2}}{2\sqrt{2\sigma_{Kfit}^2}}. \quad (22)$$

Resolving for $\sigma_{\sigma_{Kfit}^2}^2$ results in $$\sigma_{\sigma_{Kfit}^2}^2 < \frac{4P^2\sigma_{Kfit}^4}{R^2}. \quad (23)$$

Using equality (19) and inequality (23), the minimum number of samples $N_{min}$ to meet the given accuracy P with a given confidence interval R can be calculated:

$$N_{min} = \frac{R^2\left(\frac{7}{16}\sigma_{Nj}^4 + \sigma_{Nj}^2\sigma_{Ns}^2 + \sigma_{Ns}^2\right)}{P^2\sigma_{Kfit}^4}. \quad (24)$$

Inserting the expected value $$\sigma_{Kfit}^2 = \frac{\sigma_{Nj}^2}{2}$$

into the foregoing equation (24) yields $$N_{min} = \frac{4R^2\left(\frac{7}{16}\sigma_{Nj}^4 + \sigma_{Nj}^2\sigma_{Ns}^2 + \sigma_{Ns}^4\right)}{P^2\sigma_{Nj}^4}. \quad (25)$$

Using equation (25), the above-mentioned value $N_{min}$ can be calculated using only a few parameters of the device under test and measurement setup. Those are amplitude A, frequency f, the minimum expected jitter $\sigma_{Jmin}$, and the mean noise $\sigma_{Ns}$. The latter can be determined quickly, as only few samples are required for a sufficiently accurate determination of $\sigma_{Ns}$.

Moreover, using the means noise $\sigma_{Ns}$ and a sinusoidal signal with amplitude A, the well known SNR can be calculated as $$SNR = 20\log_{10}\left(\frac{A}{\sqrt{2}\,\sigma_{Ns}}\right). \quad (26)$$

Additionally, using $\sigma_{Nj}\cos(\Phi)$, a SNR can be calculated as well:

$$SNR_J = 20\log_{10}\left(\frac{A}{\sqrt{2\sigma_{Nj}^2\cos^2(\Phi)}}\right) = 20\log_{10}\left(\frac{A}{\sigma_{Nj}}\right). \quad (27)$$

Using equations (26) and (27), a margin M can be defined as follows:

$$M = SNR - SNR_J = 20\log_{10}\left(\frac{\sigma_{Nj}}{\sqrt{2}\,\sigma_{Ns}}\right). \quad (28)$$

Further using the margin, $\sigma_{Ns}$ can be expressed in terms of $\sigma_{Nj}$ and vice versa a conversion function F(M) can be defined such that $$\sigma_{Ns} = \sigma_{Nj}\frac{1}{\sqrt{2}\cdot 10^{\frac{M}{20}}} = \sigma_{Nj}F(M). \quad (29)$$

Consequently, equation (25) can now be expressed in terms of M as follows:

$$N_{min} = \frac{4R^2\left(\frac{7}{16} + F^2(M) + F^4(M)\right)}{P^2}. \quad (30)$$

The interesting property of this result is that $N_{min}$ is independent of the absolute value of the jitter $\sigma_j$ and the mean noise $\sigma_{Ns}$, but only depends on their relation, which is defined by the margin M.

In the case of the already mentioned frequency-differential approach, $N_{min}$ can be calculated in an analog manner. Setting $\sigma_{Ns1}^2 = \sigma_{Ns2}^2 = \sigma_{Ns}^2$, the cyclostationary variance is $$\sigma_K^2(\Phi) = (\sigma_{Nj1}^2 - \sigma_{Nj1}^2)\cos^2(\Phi). \quad (31)$$

By analogy with equation (13), it follows:

$$\sigma_{\sigma_K^2}^2(\Phi) = \frac{2(\sigma_{Nj1}^2\cos^2(\Phi) + \sigma_{Ns}^2)^2 + 2(\sigma_{Nj2}^2\cos^2(\Phi) + \sigma_{Ns}^2)^2}{N_{sp}-1}. \quad (32)$$

The following steps are omitted, but they are analog to equations (14) to (18), which result in $$\sigma_{\sigma_{Kfit}^2}^2 = \frac{4}{N}\left(\frac{7}{16}(\sigma_{Nj1}^4 + \sigma_{Nj2}^4) + 2\sigma_{Ns}^2(\sigma_{Nj1}^2 + \sigma_{Nj2}^2) + 2\sigma_{Ns}^4\right). \quad (33)$$

Analogous to equations (19) to (25), $N_{min}$ can be calculated. Applying the expected value yields $$\sigma_{Kfit}^2 = \frac{\sigma_{Nj1}^2 - \sigma_{N,j2}^2}{2}$$

$$N_{min} = \frac{4R^2\left(\frac{7}{16}(\sigma_{Nj1}^4 + \sigma_{Nj2}^4) + (\sigma_{Nj1}^2 + \sigma_{Nj2}^2)\sigma_{Ns}^2 + 2\sigma_{Ns}^4\right)}{P^2(\sigma_{Nj1}^4 - \sigma_{Nj2}^4)}. \quad (34)$$

Finally, to conclude the mathematical derivations, it should be mentioned that $N_{min}$ can also be written as $$N_{min} = ((2\pi A\sigma_j)^4(f_1^4-f_2^4)^4P^2)^{-1}*4R^2(\tfrac{7}{16}(f_1^4+f_2^4)(2\pi A\sigma_J)^4\sigma_N^2(f_1^2+f_2^2)(2\pi A\sigma_J)^2+2(\sigma_N^2)^2). \quad (35)$$

Analogously, if just one measurement at frequency f is done, $N_{min}$ can also be written as $$N_{min}=((2\pi f A\sigma_J)^4 P^2)^{-1} * 4R^2(\tfrac{7}{16}(2\pi f A\sigma_J)^4 + \overline{\sigma_N^2}(2\pi f A\sigma_J)^2 + (\overline{\sigma_N^2})^2). \quad (36)$$

Figure 2:
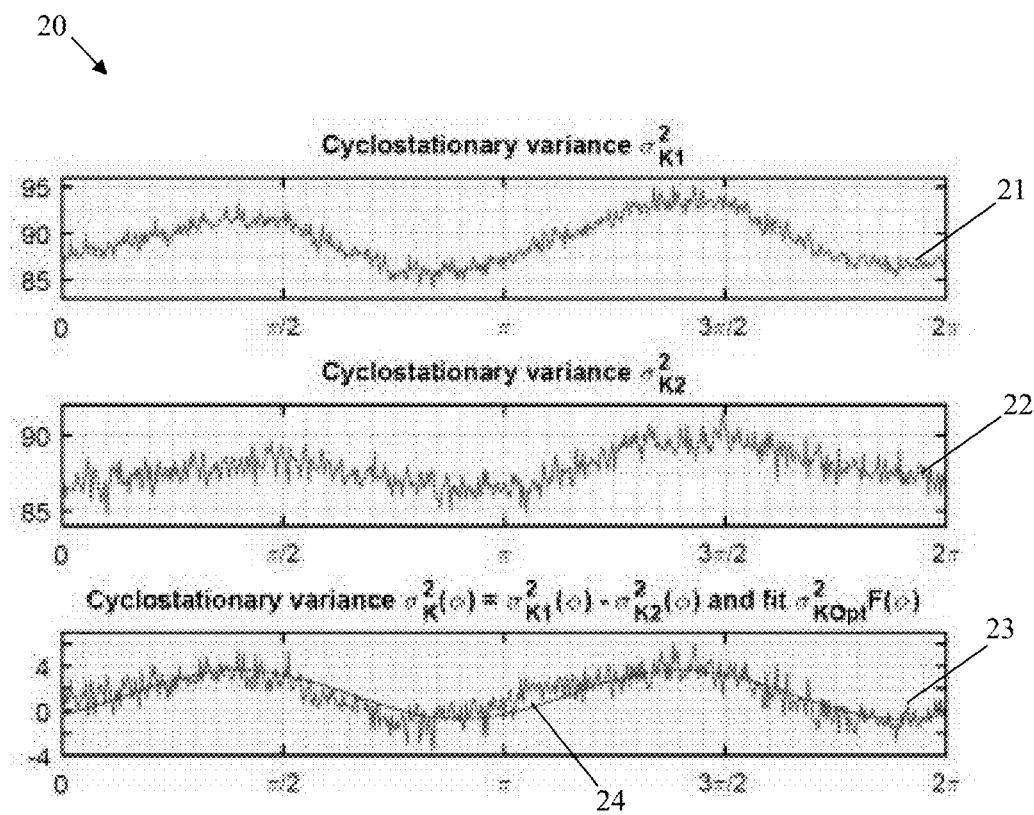
FIG. 2 shows exemplary cyclostationary variances calculated from measured data.

Now, with respect to FIG. 2, some exemplary measurement results are shown in order to verify and prove that the inventive jitter measuring device, respectively the method, works reliably in measurement.

Whereas curves 21 and 22 show the cyclostationary variances $\sigma_{K1}^2(\Phi)$ and $\sigma_{K2}^2(\Phi)$, curve 23 depicts the difference $\sigma_K^2(\Phi)=\sigma_{K1}^2(\Phi)-\sigma_{K2}^2(\Phi)$ thereof; the corresponding fitted graph $\sigma_{KOpt}^2 F(\Phi)$ is illustrated by curve 24.

For this exemplary measurement, a 10 GS/s sampler with an expected jitter of 25 fs has been characterized at input frequencies $f_1=11.7$ GHz and $f_2=1.7$ GHz using the frequency-differential cyclostationary approach described herein.

Additionally, the output signal of the primary device under test (DUT) was subsequently sampled by a post-sampler and converted to digital using an analog-to-digital converter (ADC)—generally, the jitter of a digitized signal, of an ADC, or of a sample-and-hold circuit will be determined with the aid of the inventive measuring device, respectively with the aid of the inventive method.

In accordance with the measurement results shown in FIG. 2, it is assumed that the rise in variance with the interval [π;2π] is due to post-sampling effects which are effectively eliminated by the frequency-differential approach. In this case, a jitter of 25.4 fs was calculated for the measurement, which matches the simulations well.

Figure 3:
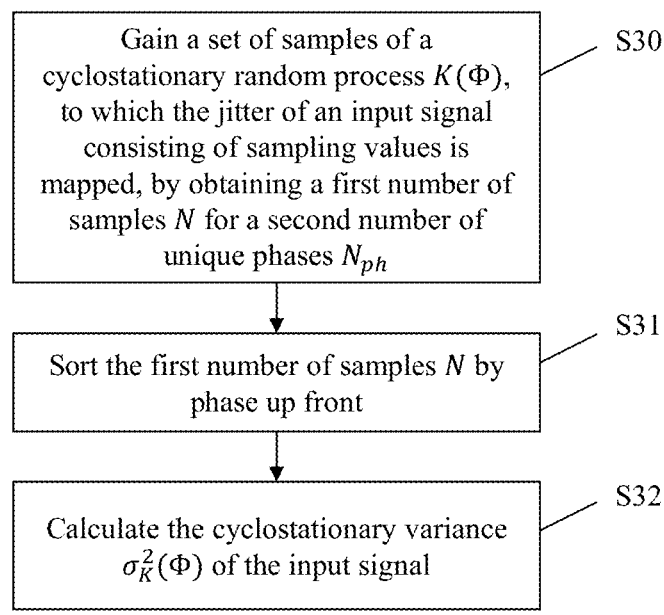
FIG. 3 shows a flow chart of an embodiment of the second aspect of the invention.

Finally, FIG. 3 shows a flow chart of the inventive jitter measuring method. In a first step S30, a set of samples of a cyclostationary random process $K(\Phi)$, to which the jitter of an input signal consisting of sampling values is mapped, is gained by obtaining a first number of samples N for a second number of unique phases $N_{ph}$. In a second step S31, the first number of samples N is sorted by phase up front. Then, in a third step S32, the cyclostationary variance $\sigma_K^2(\Phi)$ of the input signal is calculated.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring device for measuring jitter of an input signal consisting of sampling values, wherein the measuring device comprises:
    signal acquisition means, and
    calculation means,
    wherein the signal acquisition means are configured to gain a set of samples of a cyclostationary random process $K(\Phi)$, to which the jitter of the input signal is mapped, by obtaining a first number of samples N for a second number of unique phases $N_{ph}$, and sorting the first number of samples N by phase, and
    wherein the calculation means are configured to calculate:
    a cyclostationary variance $\sigma_K^2(\Phi)$ of the input signal
    the cyclostationary variance $\sigma_K^2(\Phi)$ comprising a number of frequency components according to the input signal, the amplitude of at least one of the number of frequency components by fitting at least one function prototype $F(\Phi)$ to the cyclostationary variance $\sigma_K^2(\Phi)$ with due regard to the second number of unique phases $N_{ph}$, which leads to at least one fitted function, and
    the jitter of the input signal, based at least in part on the amplitude of the at least one fitted function.

2. The measuring device according to claim 1, wherein fitting the at least one function prototype $F(\Phi)$ to the cyclostationary variance $\sigma_K^2(\Phi)$ includes calculating a scaled cross correlation at lag zero of the cyclostationary variance $\sigma_K^2(\Phi)$ with a function prototype $F(\Phi)$.

3. The measuring device according to claim 1, wherein the function prototype $F(\Phi)$ is one or more of a complex exponential function or a sine or cosine function.

4. The measuring device according to claim 1, wherein fitting the at least one function prototype $F(\Phi)$ to the cyclostationary variance $\sigma_K^2(\Phi)$ includes calculating a fitting parameter $\sigma_{KOpt}^2$, such that the product $\sigma_{KOpt}^2 F(\Phi)$ of the fitting parameter $\sigma_{KOpt}^2$ and the function prototype $F(\Phi)$ matches a term $\cos(2\Phi)$ or $\sin(2\Phi)$, depending on the zero-phase of the phase-sorting, within $\sigma_K^2(\Phi)$ best.

5. The measuring device according to claim 1, wherein for the calculation of the jitter of the input signal, the signal acquisition means and the calculation means are configured to obtain and to consider at least two cyclostationary variances $\sigma_{K1}^2(\Phi)$, $\sigma_{K2}^2(\Phi)$ ($\Phi$) at different frequencies $f_1$, $f_2$ in order to eliminate noise being frequency-invariant and non-stationary.

6. The measuring device according to claim 1, wherein the calculation means are configured to consider a predefined accuracy P of the calculation of the jitter of the input signal.

7. The measuring device according to claim 6,
    wherein the calculation means are configured to calculate a minimum number of samples required $N_{min}$ a priori according to the following equation:

$$N_{min}=((2\pi A\sigma_J)^4(f_1^4-f_2^4)^4 P^2)^{-1} * 4R^2(\tfrac{7}{16}(f_1^4+f_2^4)(2\pi A\sigma_J)^4 + \overline{\sigma_N^2}(f_1^2+f_2^2)(2\pi A\sigma_J)^2 + 2(\overline{\sigma_N^2})^2),$$

wherein for a given accuracy P, confidence interval R in multiples of one sigma, minimum expected jitter $\sigma_J^2$, frequencies $f_1$, $f_2$, amplitude A and mean noise $\overline{\sigma_N^2}$ present in the input signal, $N_{min}$ is calculated.

8. The measuring device according to claim 6, wherein, if just one measurement at frequency f is done, the calculation means are configured to calculate a minimum number of samples required $N_{min}$ a priori according to the following equation:

$$N_{min}=((2\pi f A\sigma_J)^4 P^2)^{-1} * 4R^2(\tfrac{7}{16}(2\pi f A\sigma_J)^4 + \overline{\sigma_N^2}(2\pi f A\sigma_J)^2 + (\overline{\sigma_N^2})^2),$$

wherein for a given accuracy P, confidence interval R in multiples of one sigma, minimum expected jitter amplitude $\sigma_J^2$, and mean noise $\overline{\sigma_N^2}$ present in the input signal, $N_{min}$ is calculated.

9. A measuring method for measuring jitter of an input signal consisting of sampling values, wherein the measuring method comprises:
    gaining a set of samples of a cyclostationary random process $K(\Phi)$, to which the jitter of the input signal is mapped, by obtaining a first number of samples N for a second number of unique phases $N_{ph}$;

sorting the first number of samples N by phase; and calculating a cyclostationary variance $\sigma_N^2(\Phi)$ of the input signal based at least in part on fitting at least one function prototype $F(\Phi)$ to the cyclostationary variance $\sigma_N^2(\Phi)$ by calculating a scaled cross correlation at lag zero of the cyclostationary variance $\sigma_N^2(\Phi)$ with the function prototype $F(\Phi)$.

10. The measuring method according to claim 9, wherein:
the cyclostationary variance $\sigma_K^2(\Phi)$ comprises a number of frequency components according to the input signal, an amplitude of at least one of said number of frequency components is calculated by fitting the at least one function prototype $F(\Phi)$ to the cyclostationary variance $\sigma_K^2(\Phi)$ based at least in part on the second number of unique phases $N_{ph}$, resulting in at least one fitted function, and calculating the jitter of the input signal is based at least in part on the amplitude of the at least one fitted function.

11. The measuring method according to claim 9, wherein the at least one function prototype $F(\Phi)$ is a complex exponential function or a sine or cosine function.

12. The measuring method according to claim 9, wherein fitting the at least one function prototype $F(\Phi)$ to the cyclostationary variance $\sigma_K^2(\Phi)$ includes calculating a fitting parameter $\sigma_{KOpt}^2$, such that the product $\sigma_{KOpt}^2 F(\Phi)$ of the fitting parameter $\sigma_{KOpt}^2$ and the function prototype $F(\Phi)$ matches a term $\cos(2\Phi)$ or $\sin(2\Phi)$, depending on the zero-phase of the phase-sorting, within $\sigma_K^2(\Phi)$ best.

13. The measuring method according to claim 9, wherein for the calculation of the jitter of the input signal, at least two cyclostationary variances $\sigma_{K1}^2(\Phi)$, $\sigma_{K2}^2(\Phi)$ at different frequencies $f_1$, $f_2$ are obtained and considered in order to eliminate noise being frequency-invariant and non-stationary.

14. The measuring method according to claim 9, wherein a predefined accuracy P of the calculation of the jitter of the input signal is considered.

15. The measuring method according to claim 14, wherein a minimum number of samples required $N_{min}$ is calculated a priori according to the following equation:

$N_{min} = ((2\pi A \sigma_J)^4 (f_1^4 - f_2^4)^4 P^2)^{-1} * 4R^2 (\frac{7}{16}(f_1^4 + f_2^4)(2\pi A \sigma_J)^4 + \overline{\sigma_N^2}(f_1^2 + f_2^2)(2\pi A \sigma_J)^2 + 2(\overline{\sigma_N^2})^2)$, wherein for a given accuracy P, confidence interval R in multiples of one sigma, minimum expected jitter $\sigma_J^2$, frequencies $f_1$, $f_2$, amplitude A and mean noise $\overline{\sigma_N^2}$ a present in the input signal, $N_{min}$ is calculated.

16. The measuring method according to claim 14, wherein, if just one measurement at frequency f is done, a minimum number of samples required $N_{min}$ is calculated a priori according to the following equation:

$N_{min} = ((2\pi f A \sigma_J)^4 P^2)^{-1} * 4R^2 (\frac{7}{16}(2\pi f A \sigma_J)^4 + \overline{\sigma_N^2}(2\pi f A \sigma_J)^2 + (\overline{\sigma_N^2})^2)$, wherein for a given accuracy P, confidence interval R in multiples of one sigma, minimum expected jitter $\sigma_J^2$, amplitude A and mean noise $\overline{\sigma_N^2}$ present in the input signal, $N_{min}$ is calculated.

17. A measuring device for measuring jitter of an input signal consisting of sampling values, wherein the measuring device comprises:

signal acquisition means, and calculation means, wherein the signal acquisition means are configured to gain a set of samples of a cyclostationary random process $K(\Phi)$, to which the jitter of the input signal is mapped, by obtaining a first number of samples N for a second number of unique phases $N_{ph}$, and sorting the first number of samples N by phase, and wherein the calculation means are configured to calculate a cyclostationary variance $\sigma_K^2(\Phi)$ of the input signal by fitting a function prototype $F(\Phi)$ to the cyclostationary variance $\sigma_K^2(\Phi)$ by calculating a scaled cross correlation at lag zero of the cyclostationary variance $\sigma_K^2(\Phi)$ with the function prototype $F(\Phi)$.

18. The measuring device according to claim 17, wherein:
the cyclostationary variance $\sigma_K^2(\Phi)$ comprises a number of frequency components according to the input signal, an amplitude of at least one of said number of frequency components is calculated by fitting the function prototype $F(\Phi)$ to the cyclostationary variance $\sigma_K^2(\Phi)$ based at least in part on the second number of unique phases $N_{ph}$, resulting in at least one fitted function, and calculating the jitter of the input signal is based at least in part on amplitude of the at least one fitted function.

19. The measuring device according to claim 17, wherein fitting the function prototype $F(\Phi)$ to the cyclostationary variance $a\sigma_K^2(\Phi)$ includes calculating a fitting parameter $\sigma_{KOpt}^2$, such that the product $\sigma_{KOpt}^2 F(\Phi)$ of the fitting parameter $\sigma_{KOpt}^2$ and the function prototype $F(\Phi)$ matches a term $\cos(2\Phi)$ or $\sin(2\Phi)$, depending on the zero-phase of the phase-sorting, within $\sigma_K^2(\Phi)$ best.

* * * * *